United States Patent
Ohara et al.

(10) Patent No.: US 9,608,058 B1
(45) Date of Patent: Mar. 28, 2017

(54) SEMICONDUCTOR DEVICE

(71) Applicant: KABUSHIKI KAISHA TOSHIBA, Tokyo (JP)

(72) Inventors: Ryoichi Ohara, Himeji Hyogo (JP); Takao Noda, Himeji Hyogo (JP); Yoichi Hori, Himeji Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/062,207

(22) Filed: Mar. 7, 2016

(30) Foreign Application Priority Data

Sep. 11, 2015 (JP) .................................. 2015-179327

(51) Int. Cl.
  *H01L 29/16* (2006.01)
  *H01L 29/06* (2006.01)
  *H01L 29/872* (2006.01)
  *H01L 29/78* (2006.01)
(52) U.S. Cl.
  CPC ...... *H01L 29/0634* (2013.01); *H01L 29/1608* (2013.01); *H01L 29/7811* (2013.01); *H01L 29/872* (2013.01)
(58) Field of Classification Search
  CPC ............. H01L 29/0634; H01L 29/7811; H01L 29/872; H01L 29/1608
  See application file for complete search history.

(56) References Cited

U.S. PATENT DOCUMENTS

2013/0062624 A1* 3/2013 Tsuchiya ............. H01L 29/0839
  257/77
2014/0299962 A1 10/2014 Takahashi

FOREIGN PATENT DOCUMENTS

JP   2012-186318 A   9/2012
JP     2013-12568 A   1/2013

* cited by examiner

*Primary Examiner* — Roy Potter
*Assistant Examiner* — Paul Patton
(74) *Attorney, Agent, or Firm* — Patterson & Sheridan, LLP

(57) ABSTRACT

A semiconductor device includes a SiC layer that has a first surface and a second surface, a first electrode in contact with the first surface, a first SiC region of a first conductivity type in the SiC layer, a second SiC region of a second conductivity type in the SiC layer and surrounding a portion of the first SiC region, a third SiC region of the second conductivity type in the SiC layer and surrounding the second SiC region, the third SiC region having an impurity concentration of the second conductivity type lower than that of the second SiC region, and a fourth SiC region of the second conductivity type in the SiC layer between the second SiC region and the third Sic region, the fourth SiC region having an impurity concentration of the second conductivity type higher than that of the second SiC region.

20 Claims, 9 Drawing Sheets

US 9,608,058 B1

SEMICONDUCTOR DEVICE

CROSS-REFERENCE TO RELATED APPLICATION

This application is based upon and claims the benefit of priority from Japanese Patent Application No. 2015-179327, filed on Sep. 11, 2015, the entire contents of which are incorporated herein by reference.

FIELD

Embodiments described herein relate generally to a semiconductor device.

BACKGROUND

In a vertical semiconductor device which includes electrodes on a front surface and a rear surface of a semiconductor layer, a termination structure such as a RESURF or a guard ring is provided in the periphery of an element region in order to increase a breakdown voltage. By providing the termination structure, electric field concentration at an end portion of the element region is reduced, and avalanche breakdown is prevented from occurring at the end portion of the element region.

It is preferable that a vertical semiconductor device in which avalanche breakdown does not occur at the end portion of the element region be designed such that the avalanche resistance of the vertical semiconductor device increases. The reason for this is that, if the avalanche breakdown occurs at the end portion of the element region, element breakdown easily occurs, compared to the case in which avalanche breakdown occurs inside the element region.

DETAILED DESCRIPTION

Figure 1:
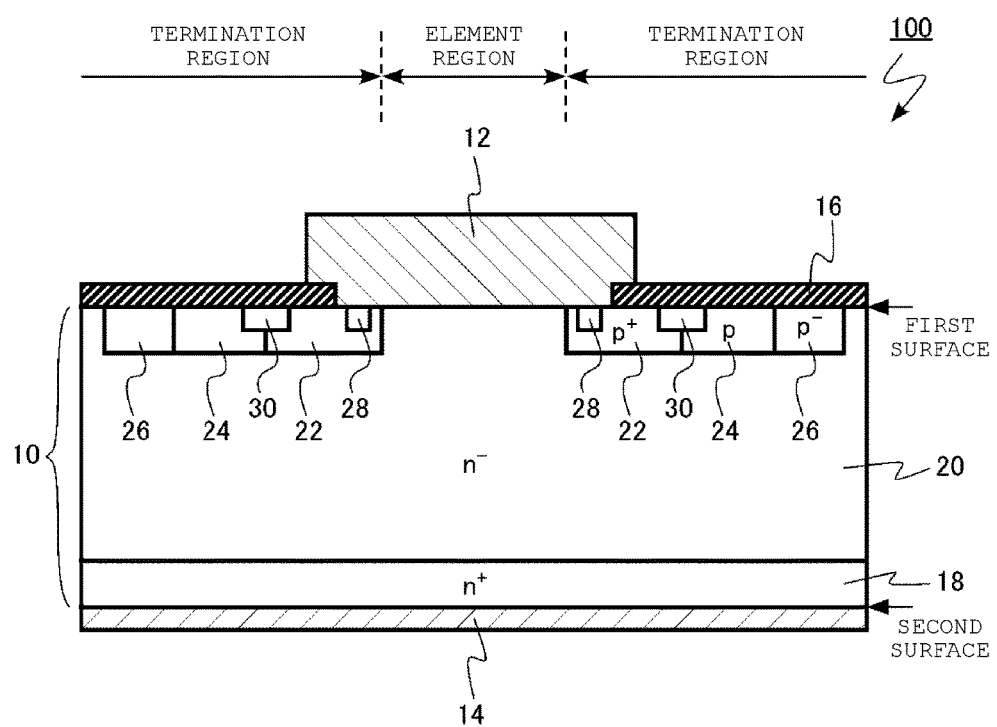
FIG. 1 is a schematic sectional view of a semiconductor device according to a first embodiment.

Embodiments provide a semiconductor device which can increase avalanche resistance.

In general, according to one embodiment, a semiconductor device includes a SiC layer that has a first surface and a second surface on an opposite side of the SiC layer from the first surface, a first electrode in contact with the first surface, a first SiC region of a first conductivity type in the SiC layer, the first SiC region having a first portion at the first surface in contact with the first electrode and a second portion on an opposite side of the first portion from the first electrode, a second SiC region of a second conductivity type in the SiC layer and surrounding the first portion of the first SiC region, a third SiC region of the second conductivity type in the SiC layer and surrounding the second SiC region, the third SiC region having an impurity concentration of the second conductivity type lower than that of the second SiC region, and a fourth SiC region of the second conductivity type in the SiC layer between the second SiC region and the third SiC region, the fourth SiC region having an impurity concentration of the second conductivity type higher than that of the second SiC region.

Hereinafter, embodiments of the invention will be described with reference to the drawings. In the following description, the same symbols or reference numerals will be given to the same or similar elements, and description of the elements described once will only be repeated as needed.

In addition, in the following description, notation of $n^+$, n and $n^-$, and $p^{++}$, $p^+$, p and $p^-$ represents relative levels of impurity concentrations of each conductivity type. That is, $n^+$-type impurity concentration is higher than n-type impurity concentration, and $n^-$-type impurity concentration is lower than n-type impurity concentration. In addition, $p^{++}$-type impurity concentration is higher than $p^+$-type impurity concentration, $p^+$-type impurity concentration is higher than p-type impurity concentration, and $p^-$-type impurity concentration is lower than p-type impurity concentration. In some cases, $n^+$ and $n^-$ are simply described as an n-type, and $p^{++}$, $p^+$ and $p^-$ are simply described as a p-type.

First Embodiment

Figure 2:
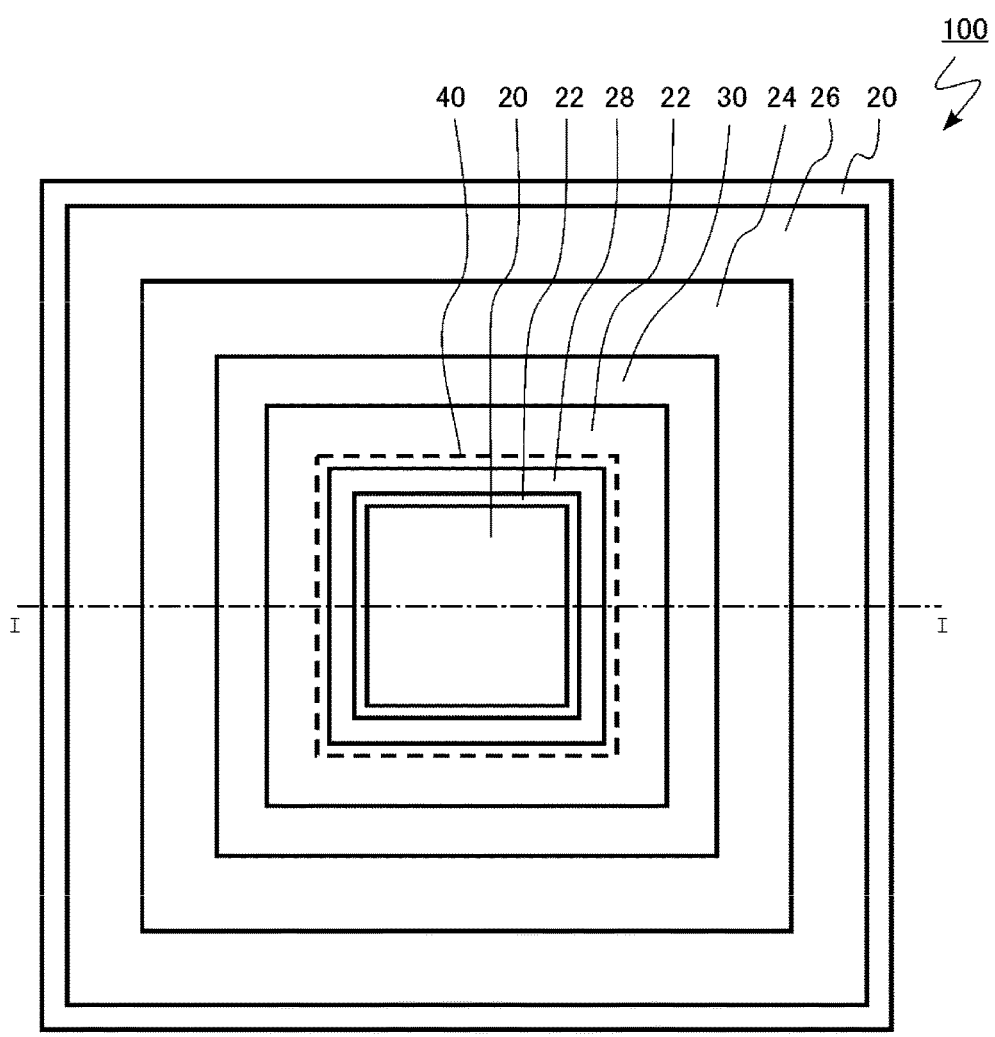
FIG. 2 is a schematic planar view of the semiconductor device according to the first embodiment.

FIG. 1 is a schematic sectional view of the semiconductor device according to the present embodiment. FIG. 2 is a schematic planar view of the semiconductor device according to the present embodiment. FIG. 2 illustrates a pattern of impurity regions on a SiC layer. FIG. 1 illustrates a cross section taken along line I-I of FIG. 2. The semiconductor device according to the present embodiment is a Schottky barrier diode (SBD) 100.

The Schottky barrier diode 100 includes an element region and a termination region which surrounds the element region. The element region functions as a region through which a current flows at the time of a forward bias of the Schottky barrier diode 100. The termination region has a termination structure provided such that the strength of an electric field which is applied to an end portion of the element region is reduced, a breakdown voltage of the end portion of the element region increases, and avalanche resistance of the Schottky barrier diode 100 increases, at the time of a forward bias of the Schottky barrier diode 100.

The Schottky barrier diode 100 includes a SiC layer 10, an anode electrode (first electrode) 12, a cathode electrode (second electrode) 14, and a field oxide film 16. In the SiC layer 10, an $n^+$-type cathode region 18, an $n^-$-type drift region (first SiC region) 20, a $p^+$-type edge region (second SiC region) 22, a first RESURF region of a p-type (third SiC region) 24, a second RESURF region of a $p^-$-type (fifth SiC region) 26, a $p^{++}$-type contact region 28, a first high concentration region of a $p^{++}$-type (fourth SiC region) 30.

The SiC layer 10 has a first surface and a second surface which is opposite to the first surface. In FIG. 1, the first surface is a surface on an upper side of FIG. 1, and the second surface is a surface on a lower side of FIG. 1.

Hereinafter, the first surface is also referred to as a front surface, and the second surface is also referred to as a rear surface.

The SiC layer 10 is, for example, a single crystal SiC (silicon carbide) of a 4H—SiC structure. A thickness of the SiC layer 10 is, for example, greater than or equal to 5 μm and smaller than or equal to 600 μm.

The $n^+$-type cathode region 18 is provided on the second surface of the SiC layer 10. The cathode region 18 contains n-type impurity. The n-type impurity is, for example, nitride (N). Impurity concentration of the n-type impurity is, for example, higher than or equal to $1\times10^{18}$ cm$^{-3}$ and lower than or equal to $1\times10^{20}$ cm$^{-3}$.

The $n^-$-type drift region (first SiC region) 20 is provided on the cathode region 18. A portion of the $n^-$-type drift region 20 is provided at a front surface of the element region. The drift region 20 contains n-type impurity. The n-type impurity is, for example, nitride (N). Impurity concentration of the n-type impurity is, for example, higher than or equal to $5\times10^{14}$ cm$^{-3}$ and lower than or equal to $1\times10^{17}$ cm$^{-3}$.

The $p^+$-type edge region (second SiC region) 22 is provided so that at least a portion thereof surrounds a region 40 (region surrounded by a dotted line of FIG. 2) in which the anode electrode 12 and the front surface of the SiC layer 10 come into contact with each other. The edge region 22 is provided on the drift region 20 and at and inwardly of the front surface of the SiC layer 10. The edge region 22 is provided to surround the element region.

The edge region 22 contains p-type impurity. The p-type impurity is, for example, aluminum (Al). The impurity concentration of the p-type impurity is, for example, higher than or equal to $5\times10^{17}$ cm$^{-3}$ and lower than or equal to $5\times10^{19}$ cm$^{-3}$.

The first RESURF region of a p-type (third SiC region) 24 is provided to surround the edge region 22. The first RESURF region 24 is provided on the drift region 20 and at and inwardly of the front surface of the SiC layer 10. The edge region 22 and the first RESURF region 24 come into contact with each other.

The first RESURF region 24 contains p-type impurity. The p-type impurity is, for example, aluminum (Al). Impurity concentration of the p-type impurity of the first RESURF region 24 is lower than impurity concentration of the p-type impurity of the edge region 22. Impurity concentration of the p-type impurity is, for example, higher than or equal to $5\times10^{16}$ cm$^{-3}$ and lower than or equal to $1\times10^{18}$ cm$^{-3}$.

The second RESURF region of a $p^-$-type (fifth SiC region) 26 is provided so as to surround the first RESURF region 24. The second RESURF region 26 is provided on the drift region 20 and at and inwardly of the front surface of the SiC layer 10. The first RESURF region 24 and the second RESURF region 26 come into contact with each other.

The second RESURF region 26 contains p-type impurity. The p-type impurity is, for example, aluminum (Al). Impurity concentration of the p-type impurity of the second RESURF region 26 is lower than impurity concentration of the p-type impurity of the first RESURF region 24. Impurity concentration of the p-type impurity is, for example, higher than or equal to $1\times10^{16}$ cm$^{-3}$ and lower than or equal to $1\times10^{18}$ cm$^{-3}$.

The $p^{++}$-type contact region 28 is provided in the edge region 22. The $p^{++}$-type contact region 28 is provided at and inwardly of the front surface of the SiC layer 10.

The $p^{++}$-type contact region 28 contains p-type impurity. The p-type impurity is, for example, aluminum (Al). Impurity concentration of the p-type impurity of the $p^{++}$-type contact region 28 is higher than impurity concentration of the p-type impurity of the edge region 22. Impurity concentration of the p-type impurity is, for example, higher than or equal to $1\times10^{19}$ cm$^{-3}$ and lower than or equal to $1\times10^{21}$ cm$^{-3}$.

The first high concentration region of $p^{++}$-type (fourth SiC region) 30 is provided between the edge region 22 and the first RESURF region 24. The first high concentration region 30 is provided in a boundary portion between the edge region 22 and the first RESURF region 24. The first high concentration region 30 has a pattern of a ring shape which surrounds the edge region 22. The first high concentration region 30 comes into contact with the edge region 22 and the first RESURF region 24.

The first high concentration region 30 contains p-type impurity. The p-type impurity is, for example, aluminum (Al). Impurity concentration of the p-type impurity of the first high concentration region 30 is higher than impurity concentration of the p-type impurity of the edge region 22 and the first RESURF region 24.

A depth from the front surface of the SiC layer 10 of the first high concentration region 30 is smaller than a depth from the front surface of the SiC layer 10 of the edge region 22 and the first RESURF region 24. The depth of the first high concentration region 30 is, for example, greater than or equal to 0.05 μm and less than or equal to 1.0 μm. Depths of the edge region 22 and the first RESURF region 24 are, for example, greater than or equal to 0.1 μm and less than or equal to 1.0 μm.

Impurity concentration of the SiC layer 10 can be measured by using a secondary ion mass spectrometry (SIMS) method. In addition, a relative level of the impurity concentration can also be determined from a level of a carrier concentration which is obtained by, for example, a scanning capacitance microscopy (SCM). In addition, a depth of an impurity region can be obtained by, for example, the SIMS. In addition, the depth of the impurity region can be obtained based on, for example, a synthetic image of an SCM image and an atomic force microscopy (AFM) image.

The field oxide film 16 is provided on the front surface of the SiC layer 10. The field oxide film 16 is provided on the edge region 22, the first RESURF region 24, the second RESURF region 26, and the first high concentration region 30.

The field oxide film 16 includes an opening in the element region. The field oxide film 16 is, for example, a silicon oxide film. A thickness the field oxide film 16 is, for example, greater than or equal to 0.01 μm and smaller than or equal to 10 μm.

The anode electrode (first electrode) 12 comes into contact with the drift region 20, the edge region 22, and the contact region 28, in the opening of the field oxide film 16. A contact between the anode electrode 12 and the drift region 20 is a Schottky contact. It is preferable that a contact between the anode electrode 12 and the contact region 28 is an Ohmic contact.

The anode electrode 12 is metallic. The anode electrode 12 is, for example, a stacked film of titanium (Ti) and aluminum (Al).

The cathode electrode 14 is provided to come into contact with the rear surface of the SiC layer 10. The cathode electrode 14 is provided to come into contact with the cathode region 18. It is preferable that contact between the cathode electrode 14 and the cathode region 18 is an Ohmic contact.

The cathode region 18 is metallic. The cathode region 18 includes, for example, a stacked film of nickel silicide and a metal.

Next, actions and effects of the SBD 100 of the present embodiment will be described.

In the vertical SBD, when a reverse bias is applied, if avalanche breakdown occurs in an end portion of the element region by an electric field which is concentrated in the end portion of the element region, element breakdown easily occurs and avalanche resistance decreases. In order to reduce concentration of the electric field in the end portion of the element region, for example, a p-type RESURF region is provided in the termination region in the periphery of the element region. Since the p-type RESURF region is depleted, the electric field strength which is applied to the end portion of the element region is reduced, avalanche breakdown is prevented from occurring in most cases in the end portion of the element region, and avalanche resistance of the SBD increases.

However, by providing the p-type RESURF region, a p-type region in the termination region becomes, for example, a multistage structure of the $p^+$-type edge region and the p-type RESURF region. Then, an electric field becomes concentrated in a place in which impurity concentration of p-type impurity changes, whereby electric field strength increases. Hence, avalanche breakdown occurs in the place, and there is concern that sufficient avalanche resistance is not obtained.

If the multistage structure of the concentration of the p-type region is formed by ion injection by which the amount of dosage is changed, and annealing, impurity concentration of the p-type impurity is rapidly changed, particularly in the SiC. The reason is that impurity diffusion in SiC is much slower than that in, for example, silicon (Si). If aluminum (Al) is used as p-type impurity, impurity concentration of the p-type impurity is rapidly changed in particular, because a diffusion coefficient in the SiC is extremely small.

If the impurity concentration is rapidly changed, electric field strength increases. In order to increase the avalanche resistance of the SBD, it is preferable that the electric field strength is reduced in location at which impurity concentration of the p-type impurity is changed.

In the SBD 100 according to the present embodiment, the first high concentration region 30 with higher impurity concentration of p-type impurity than those in the edge region 22 and the first RESURF region 24 is provided in a boundary portion between the edge region 22 in which impurity concentration of p-type impurity is changed, and the first RESURF region 24.

By providing the first high concentration region 30, when a reverse bias is applied to the SBD 100, a leakage current flows between the edge region 22 and the first RESURF region 24. The electric field strength of the boundary portion between the edge region 22 and the first RESURF region 24 is reduced by a voltage drop due to the leakage current. Hence, avalanche breakdown is prevented from occurring in most cases in the boundary portion between the edge region 22 and the first RESURF region 24. Thus, the avalanche resistance of the SBD 100 increases. The leakage current is caused by impurity concentration of the high p-type impurity of the first high concentration region 30, and crystal defect which is generated when the first high concentration region 30 is formed as a result of Al ion implantation.

It is preferable that a depth of the first high concentration region 30 is smaller than depths of the edge region 22 and the first RESURF region 24. If the depth of the first high concentration region 30 is too deep, there is possibility that the first high concentration region 30 comes into contact with the drift region 20, and a leakage current at the time of reverse bias of the SBD 100 increases.

In addition, it is preferable that impurity concentration of the p-type impurity of the first high concentration region 30 is higher than impurity concentration of the p-type impurity of the edge region 22 by an order of magnitude or more, so that electric field strength of the boundary portion between the edge region 22 and the first RESURF region 24 is reduced. In addition, it is preferable that impurity concentration of the p-type impurity of the first high concentration region 30 is higher than or equal to $1\times10^{19}$ cm$^{-3}$ and lower than or equal to $1\times10^{21}$ cm$^{-3}$.

As such, according to the SBD 100 according to the present embodiment, the electric field strength in the termination region is reduced, and thereby an increase of the avalanche resistance is realized.

Second Embodiment

A semiconductor device according to the present embodiment is different from the semiconductor device according to the first embodiment in that the first high concentration region of a $p^{++}$-type (fourth SiC region) 30 also serves as a $p^{++}$-type contact region. Hereinafter, a portion of the description that overlaps with that of the first embodiment will be omitted.

Figure 3:
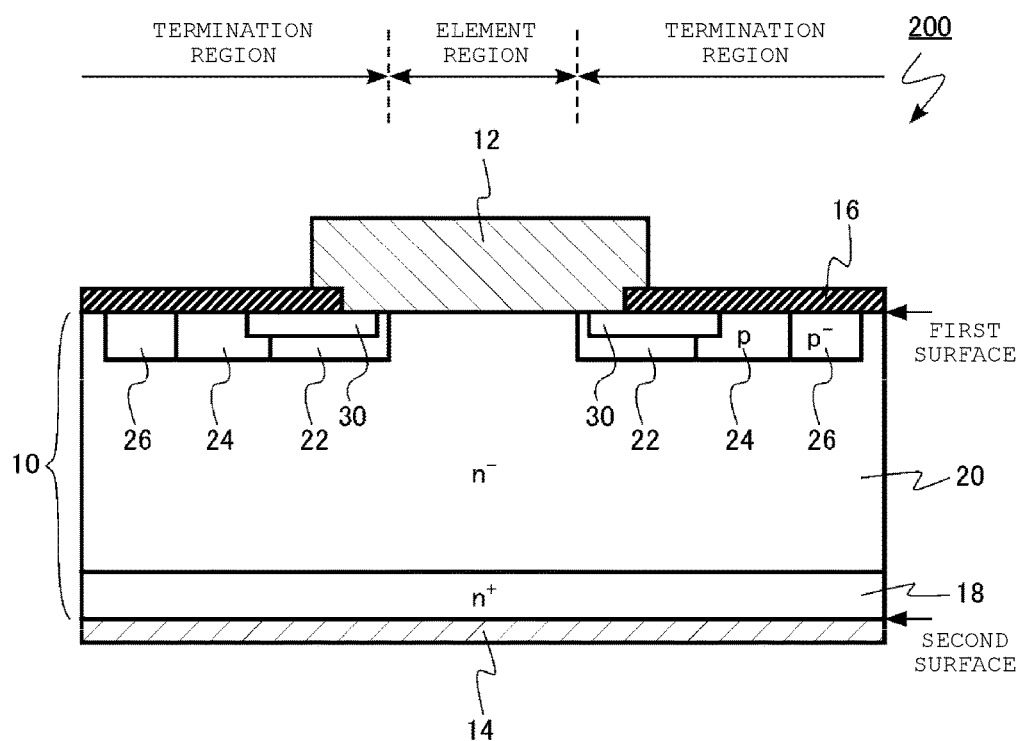
FIG. 3 is a schematic sectional view of a semiconductor device according to a second embodiment.

FIG. 3 is a schematic sectional view of a semiconductor device according to the present embodiment. The semiconductor device according to the present embodiment is an SBD 200.

In the SBD 200, the anode electrode 12 comes into contact with the first high concentration region of a $p^{++}$-type (fourth SiC region) 30. The first high concentration region 30 also serves as a contact region for reducing a contact resistance of the anode electrode 12.

According to the SBD 200 according to the present embodiment, electric field strength in the termination region is reduced and an increase in avalanche resistance is realized as in the first embodiment.

Third Embodiment

A semiconductor device according to the present embodiment is different from the semiconductor device according to the first embodiment in that the depth from the first surface of the fourth SiC region is greater than or equal to the depth from the first surface of the second SiC region and the third SiC region. Hereinafter, a portion of the description that overlaps with that of the first embodiment will be omitted.

Figure 4:
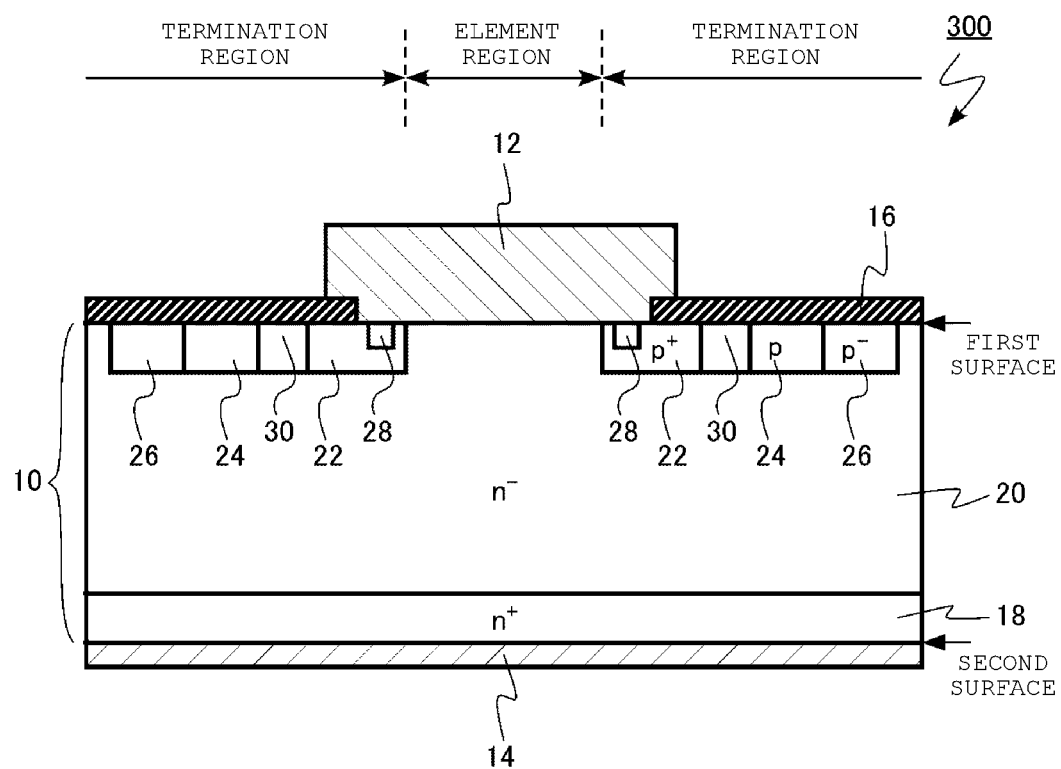
FIG. 4 is a schematic sectional view of a semiconductor device according to a third embodiment.

FIG. 4 is a schematic sectional view of a semiconductor device according to the present embodiment. The semiconductor device according to the present embodiment is an SBD 300.

In the SBD 300, the depth from the front surface of the SiC layer 10 of the first high concentration region 30 is equal to, or greater than the depth from the front surface of the SiC layer 10 of the edge region 22 and the first RESURF region 24.

According to the SBD 300 according to the present embodiment, electric field strength in the termination region is reduced and an increase of avalanche resistance is realized as in the first embodiment.

Fourth Embodiment

A semiconductor device according to the present embodiment is different from the semiconductor device according to the first embodiment in that a second high concentration region is provided between the third SiC region and the fifth SiC region. Hereinafter, a portion of the description that overlaps with that of the first embodiment will be omitted.

Figure 5:
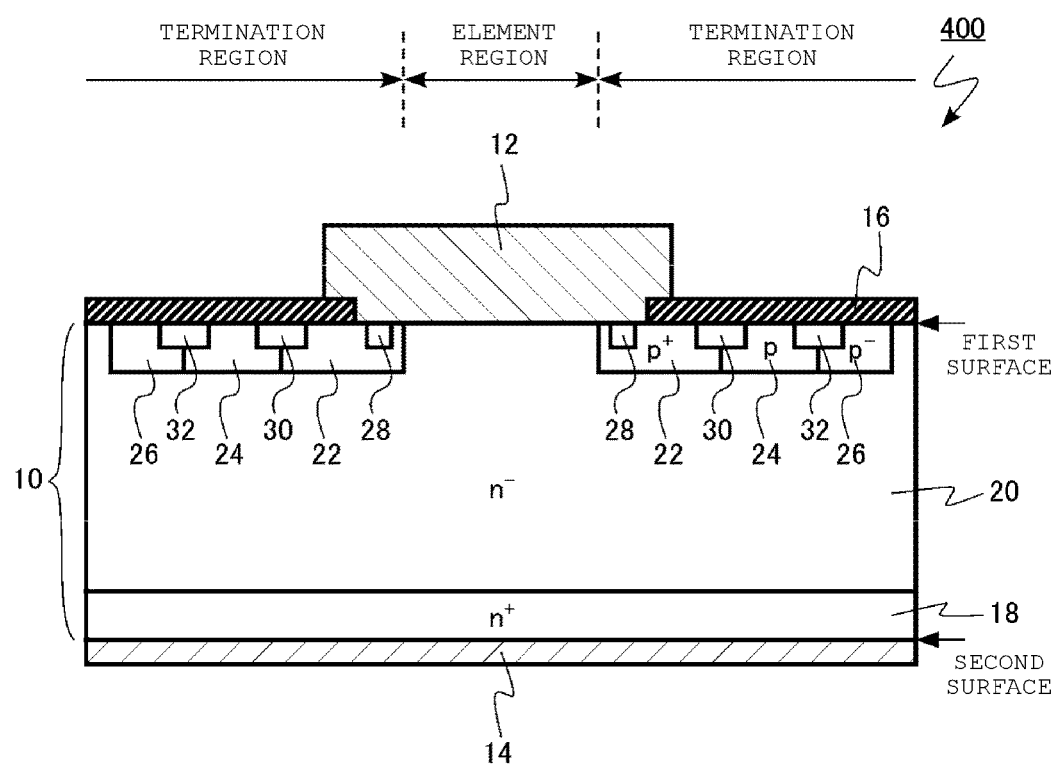
FIG. 5 is a schematic sectional view of a semiconductor device according to a fourth embodiment.

FIG. 5 is a schematic sectional view of a semiconductor device according to the present embodiment. The semiconductor device according to the present embodiment is an SBD 400.

The SBD 400 includes a second high concentration region of a p$^+$-type 32. The second high concentration region of a p$^+$-type 32 is provided between the first RESURF region 24 and the second RESURF region 26. The second high concentration region 32 is provided in a boundary portion between the first RESURF region 24 and the second RESURF region 26. The second high concentration region 32 has a ring pattern which surrounds the first RESURF region 24.

The second high concentration region 32 contains p-type impurity. The p-type impurity is, for example, aluminum (Al). Impurity concentration of the p-type impurity of the second high concentration region 32 is higher than impurity concentration of the p-type impurity of the first RESURF region 24 and the second RESURF region 26.

A depth from the front surface of the SiC layer 10 of the second high concentration region 32 is smaller than the depth from the front surface of the SiC layer 10 of the first RESURF region 24 and the second RESURF region 26. The depth of the second high concentration region 32 is, for example, greater than or equal to 0.05 μm and smaller than or equal to 1.0 μm. The depths of the first RESURF region 24 and the second RESURF region 26 are, for example, greater than or equal to 0.1 μm and smaller than or equal to 1.0 μm.

Electric field strength of the boundary portion between the first RESURF region 24 and the second RESURF region 26 is reduced by providing the second high concentration region 32. Hence, avalanche breakdown in the boundary portion between the first RESURF region 24 and the second RESURF region 26 is prevented from occurring in most cases. Thus, avalanche resistance of the SBD 400 increases.

In the SBD 400 according to the present embodiment, electric field strength in the termination region is reduced and an increase of avalanche resistance is realized as in the first embodiment.

Fifth Embodiment

A semiconductor device according to the present embodiment is different from the semiconductor device according to the first embodiment in that a shape of the first surface of the fourth SiC region is not a ring shape and an island shape. Hereinafter, a portion of the description that overlaps with that of the first embodiment will be omitted.

Figure 6:
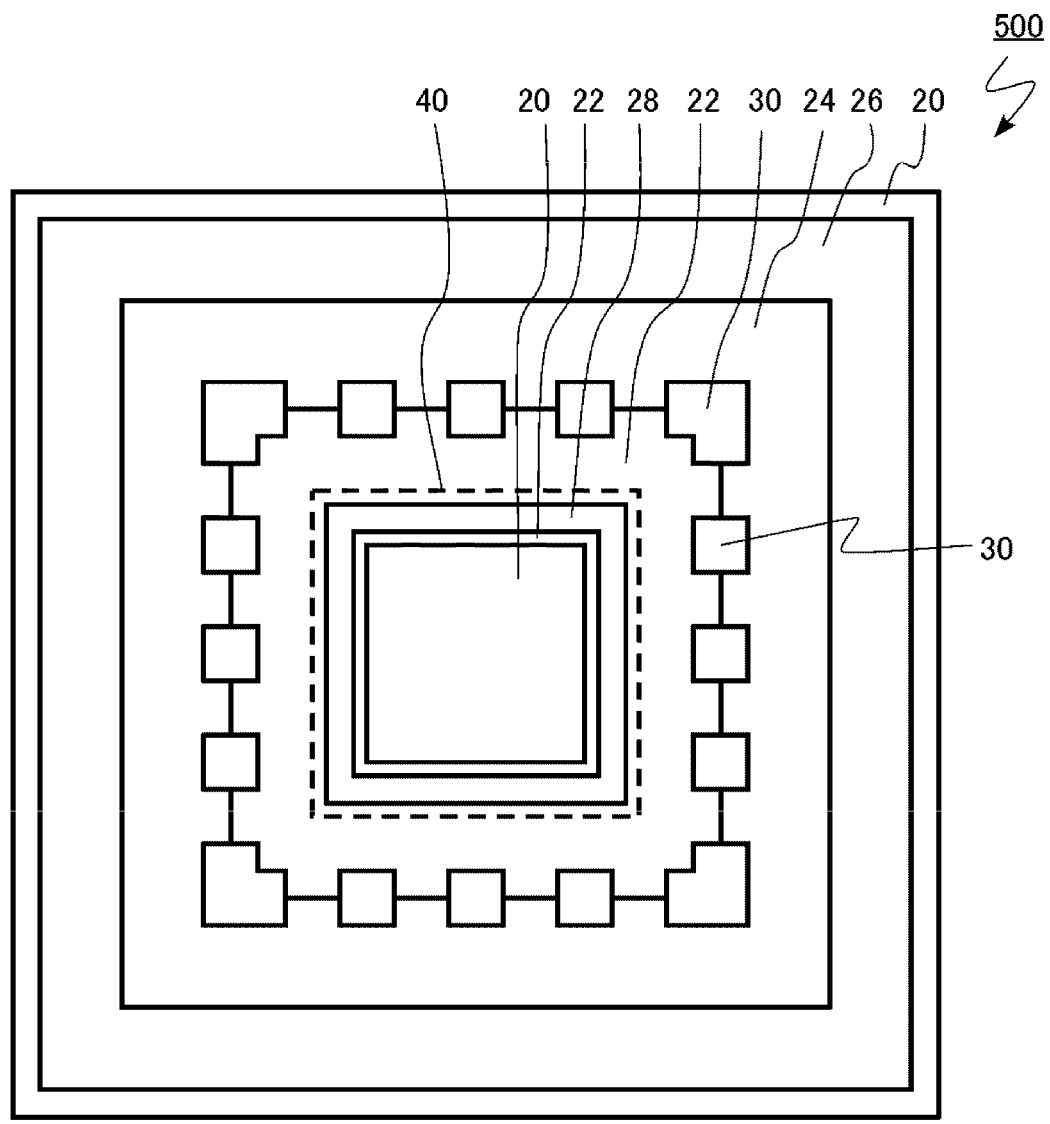
FIG. 6 is a schematic planar view of a semiconductor device according to a fifth embodiment.

FIG. 6 is a schematic planer view of a semiconductor device according to the present embodiment. FIG. 6 illustrates a pattern of impurity region on the semiconductor device. The semiconductor device according to the present embodiment is an SBD 500.

As illustrated in FIG. 6, in the SBD 500, the first high concentration region 30 has a pattern of an island shape which is provided between the edge region 22 and the first RESURF region 24, on the front surface of the SiC layer 10.

According to the SBD 500 according to the present embodiment, electric field strength in the termination region is reduced and an increase of avalanche resistance is realized as in the first embodiment.

Sixth Embodiment

A semiconductor device according to the present embodiment is different from the semiconductor device according to the first embodiment in that the semiconductor device according to the present embodiment is a PIN diode which includes a p-type anode region between the first surface of the SiC layer and the first SiC region. Hereinafter, a portion of the description that overlaps with that of the first embodiment will be omitted.

Figure 7:
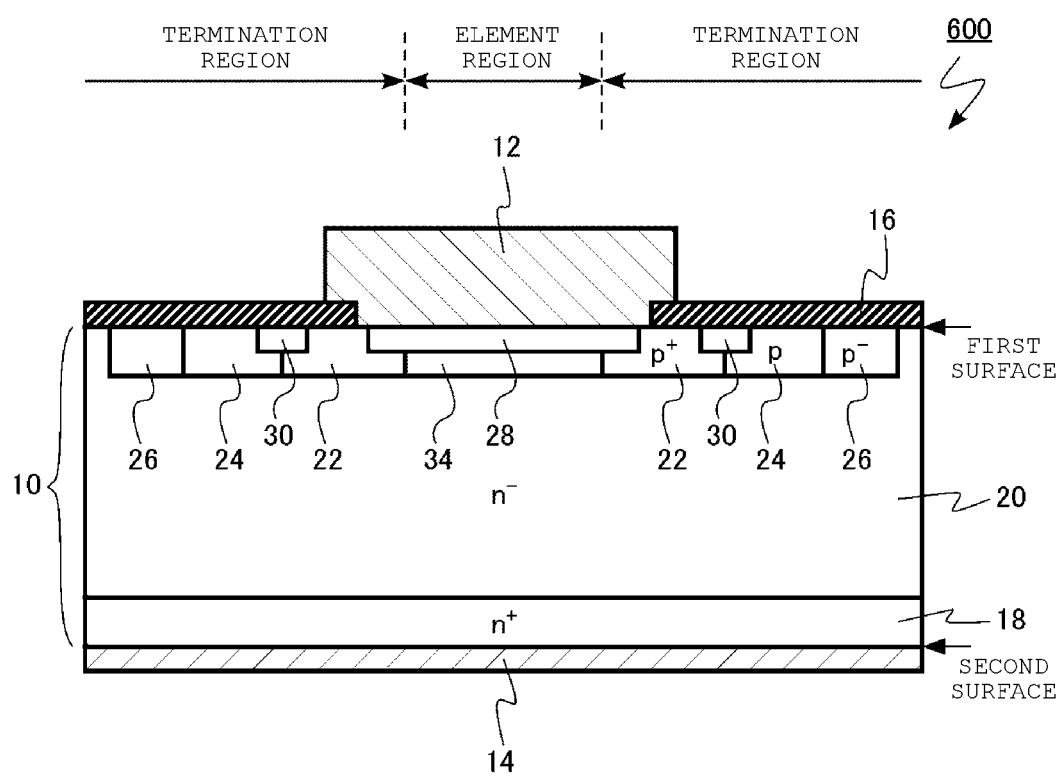
FIG. 7 is a schematic sectional view of a semiconductor device according to a sixth embodiment.

FIG. 7 is a schematic sectional view of a semiconductor device according to the present embodiment. The semiconductor device according to the present embodiment is a PIN diode 600.

The PIN diode 600 includes a p$^+$-type anode region 34. The anode electrode 12 is electrically coupled to the anode region 34. The p$^+$-type anode region 34 comes into contact with the edge region 22.

The p$^+$-type anode region 34 contains p-type impurity. The p-type impurity is, for example, aluminum (Al). Impurity concentration of the p-type impurity is, for example, higher than or equal to $1 \times 10^{18}$ cm$^{-3}$ and lower than or equal to $1 \times 10^{19}$ cm$^{-3}$.

The p$^{++}$-type contact region 28 is provided between the anode electrode 12 and the anode region 34. The anode electrode 12 comes into contact with the p$^{++}$-type contact region 28.

A structure of the termination region is the same as in the first embodiment.

According to the PIN diode 600 according to the present embodiment, electric field strength in the termination region is reduced and an increase of avalanche resistance is realized as in the first embodiment.

Seventh Embodiment

A semiconductor device according to the present embodiment is different from the semiconductor device according to the first embodiment in that the semiconductor device according to the present embodiment is a MOSFET. Hereinafter, a portion of the description that overlaps with that of the first embodiment will be omitted.

Figure 8:
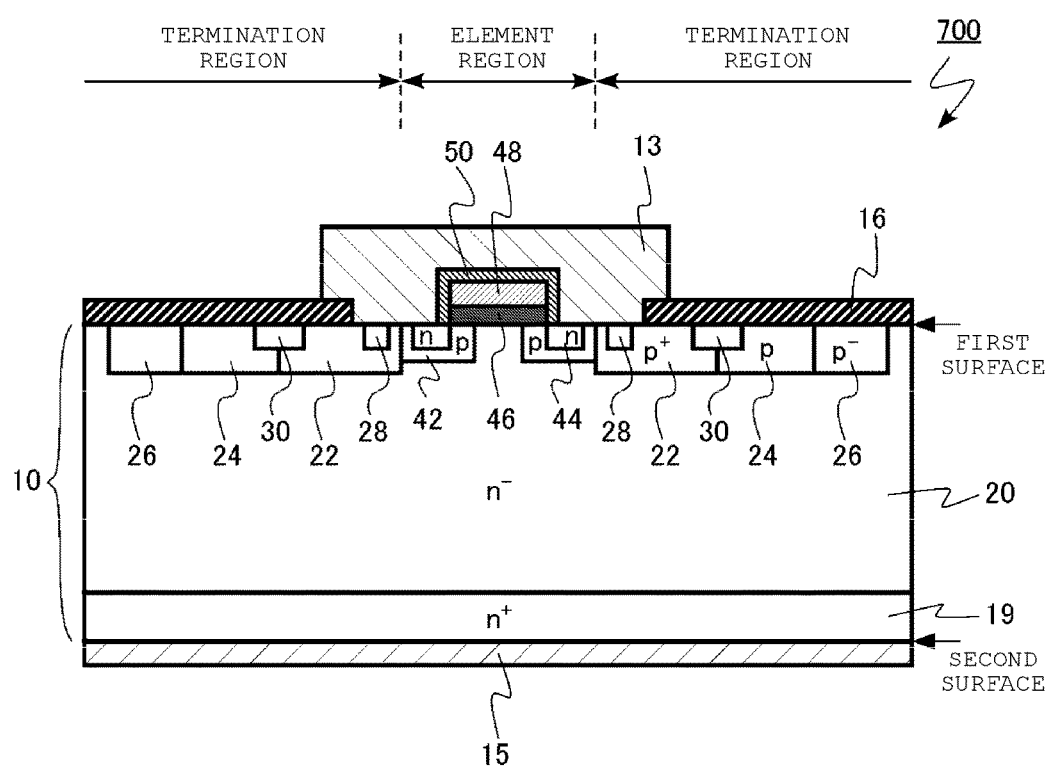
FIG. 8 is a schematic sectional view of a semiconductor device according to a seventh embodiment.

FIG. 8 is a schematic sectional view of a semiconductor device according to the present embodiment. The semiconductor device according to the present embodiment is a metal oxide semiconductor field effect transistor (MOSFET) 700.

In the MOSFET 700, an element region includes a p-type body region 42 which is provided on a front surface of the SiC layer 10, an n$^+$-type source region 44, a gate insulating film 46, a gate electrode 48, an interlayer film 50, an n$^+$-type drain region 19, a source electrode (first electrode) 13, a drain electrode (second electrode) 15.

The source electrode (first electrode) 13 is electrically coupled to the body region 42 and the source region 44. The source electrode (first electrode) 13 comes into contact with the source region 44. The gate electrode 48 and the source electrode 13 are insulated with each other by the interlayer film 50.

A structure of the termination region is the same as in the first embodiment.

In the MOSFET 700 according to the present embodiment, electric field strength in the termination region is reduced and an increase of avalanche resistance is realized as in the first embodiment.

Eighth Embodiment

A semiconductor device according to the present embodiment includes a SiC layer that has a first surface and a second surface; a first electrode that comes into contact with the first surface; a first SiC region of a first conductivity type that is provided in the SiC layer; a second SiC region of the second conductivity type that is provided in the SiC layer such that at least a portion of the second SiC region surrounds a region in which the first electrode and the first surface come into contact with each other, and is provided between the first SiC region and the first surface; a third SiC region of a second conductivity type that is provided in the SiC layer to surround the second SiC region, is provided between the first SiC region and the first surface, and contains impurity concentration of the second conductivity type lower than impurity concentration of the second SiC region; and a fourth SiC region that is provided in the SiC layer between the second SiC region and the third Sic region, and has crystal defect density higher than crystal defect densities of the second SiC region and the third Sic region.

A semiconductor device according to the present embodiment is different from the semiconductor device according to the first embodiment in that the fourth SiC region is a region with high crystal defect density. Hereinafter, a portion of the description that overlaps with that of the first embodiment will be omitted.

Figure 9:
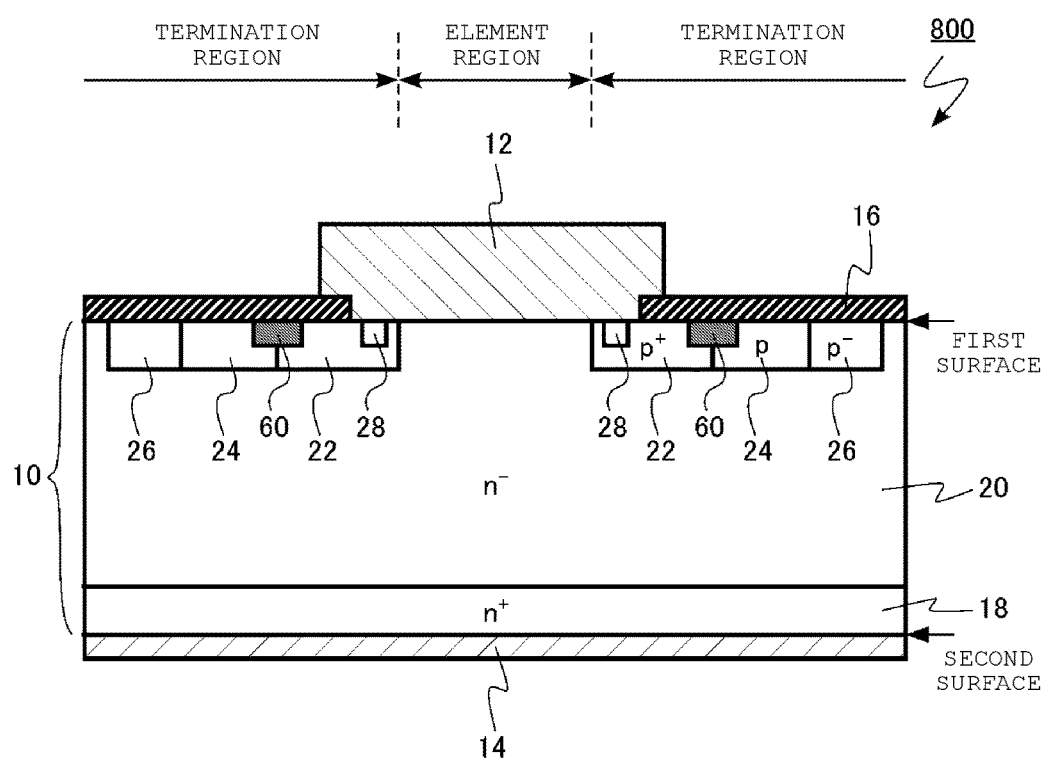
FIG. 9 is a schematic sectional view of a semiconductor device according to an eighth embodiment.

FIG. 9 is a schematic sectional view of a semiconductor device according to the present embodiment. The semiconductor device according to the present embodiment is an SBD 800.

The SBD 800 includes an element region and a termination region which surrounds the element region. The element region functions as a region through which a current flows at the time of a forward bias of the SBD 800. The termination region has a termination structure provided such that the strength of an electric field that is applied to an end portion of the element region is reduced at the time of a reverse bias of the SBD 800, and an element breakdown voltage of the SBD 800 increases.

The SBD 800 includes the SiC layer 10, the anode electrode 12, the cathode electrode 14, and the field oxide film 16. The $n^+$-type cathode region 18, the $n^-$-type drift region (first SiC region) 20, the $p^+$-type edge region (second SiC region) 22, the first RESURF region of a p-type (third SiC region) 24, the second RESURF region of a $p^-$-type (fifth SiC region) 26, the $p^{++}$-type contact region 28, a high defect density region (fourth SiC region) 60 are provided in the SiC layer 10.

The SiC layer 10 includes a first surface and a second surface which is opposite to the first surface. In FIG. 9, the first surface is a surface on an upper side of FIG. 1, and the second surface is a surface on a lower side of FIG. 1. Hereinafter, the first surface is also referred to as a front surface, and the second surface is also referred to as a rear surface.

The high defect density region (fourth SiC region) 60 is provided between the edge region 22 and the first RESURF region 24. The high defect density region 60 is provided in a boundary portion between the edge region 22 and the first RESURF region 24. The high defect density region 60 has, for example, a ring pattern which surrounds the edge region 22.

The high defect density region 60 has crystal defect density higher than crystal defect densities of the edge region 22 and the first RESURF region 24. The high defect density region 60 is formed by ion injection of, for example, argon (Ar). The high defect density region 60 contains, for example, argon (Ar).

A depth from a front surface of the SiC layer 10 of the high defect density region 60 is smaller than the depth from a front surface of the SiC layer 10 of the edge region 22 and the first RESURF region 24. A depth of the high defect density region 60 is, for example, greater than or equal to 0.05 µm and smaller than or equal to 1.0 µm. Depths of the edge region 22 and the first RESURF region 24 are, for example, greater than or equal to 0.1 µm and smaller than or equal to 1.0 µm.

Crystal defect density of the high defect density region 60 and crystal defect density of the edge region 22 and the first RESURF region 24 can be compared to each other by, for example, a transmission electron microscope (TEM). Whether or not the high defect density region 60 contains argon (Ar) can be determined by, for example, a SIMS.

By providing the high defect density region 60, when a reverse bias is applied to the SBD 800, a leakage current due to crystal defect flows between the edge region 22 and the first RESURF region 24. The electric field strength of the boundary portion between the edge region 22 and the first RESURF region 24 is reduced by a voltage drop due to the leakage current. Hence, avalanche breakdown is preventing from occurring in most cases in the boundary portion between the edge region 22 and the first RESURF region 24. Thus, breakdown voltage of the SBD 800 increases.

It is preferable that the depth of the SiC layer 10 of the high defect density region 60 is smaller than the depths of the edge region 22 and the first RESURF region 24. If the depth of the high defect density region 60 is too deep, the high defect density region 60 comes into contact with the drift region 20, and there is a concern that the leakage current at the time of a reverse bias of the SBD 800 increases.

As such, according to the SBD 800 according to the present embodiment, electric field strength in the termination region is reduced, whereby an increase of avalanche resistance is realized.

In the first to eighth embodiments, a case in which 4H—SiC is used as a crystal structure of SiC is described as an example, but exemplary embodiments can also be applied to a device which uses SiC with other crystal structures such as, 6H—SiC or 3C—SiC.

In addition, in the embodiments, examples in which an SBD, a PIN diode, and a MOSFET are mainly used are described, but exemplary embodiments can also be applied to other devices such as, a metal insulator semiconductor field effect transistor (MISFET) or an insulated gate bipolar transistor (IGBT), as long as the device includes a termination region in the periphery of an element region.

In addition, in the embodiments, a case in which the first conductivity type is an n-type and the second conductivity type is a p-type is described, but the first conductivity type may be a p-type and the second conductivity type may be an n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a SiC layer that has a first surface and a second surface on an opposite side of the SiC layer from the first surface;
a first electrode in contact with the first surface;
a first SiC region of a first conductivity type in the SiC layer, the first SiC region having a first portion at the first surface in contact with the first electrode and a second portion on an opposite side of the first portion from the first electrode;
a second SiC region of a second conductivity type in the SiC layer and surrounding the first portion of the first SiC region;
a third SiC region of the second conductivity type in the SiC layer and surrounding the second SiC region, the third SiC region having an impurity concentration of the second conductivity type lower than that of the second SiC region; and
a fourth SiC region of the second conductivity type in the SiC layer between the second SiC region and the third SiC region, the fourth SiC region having an impurity concentration of the second conductivity type higher than that of the second SiC region.

2. The device according to claim 1, further comprising: a second electrode on the second surface.

3. The device according to claim 1, wherein the first electrode is electrically coupled to the second SiC region.

4. The device according to claim 1, wherein a depth from the first surface of the fourth SiC region is smaller than a depth from the first surface of the second SiC region and the third SiC region.

5. The device according to claim 1, wherein a depth from the first surface of the fourth SiC region is the same as a depth from the first surface of the second SiC region and the third SiC region.

6. The device according to claim 4, wherein the second SiC region is in contact with the third SiC region.

7. The device according to claim 1, further comprising:
a fifth SiC region in the SiC layer and surrounding the third SiC region, the fifth SiC region having an impurity concentration of the second conductivity type lower than that of the third SiC region.

8. The device according to claim 7, further comprising:
a sixth SiC region in the second SiC region and in contact with the first electrode, the sixth SiC region having an impurity concentration of the second conductivity type higher than that of the second SiC region.

9. The device according to claim 7, further comprising:
another SiC region of the second conductivity type in the SiC layer between the third SiC region and the fifth SiC region, and having an impurity concentration of the second conductivity type higher than that of the third SiC region.

10. The device according to claim 1, wherein the fourth SiC region has a continuous structure at the first surface.

11. The device according to claim 1, wherein the fourth SiC region has a discontinuous structure at the first surface.

12. The device according to claim 1, further comprising:
body and source regions for a metal oxide field effect transistor (MOSFET) in the SiC layer; and
a gate electrode for the MOSFET between the first electrode and the first portion of the first SiC region, wherein
the first electrode is a source electrode of the metal oxide field effect transistor.

13. A semiconductor device comprising:
a SiC layer that has a first surface and a second surface on an opposite side of the SiC layer from the first surface;
a first electrode in contact with the first surface;
a first SiC region of a first conductivity type in the SiC layer, the first SiC region having a first portion at the first surface in contact with the first electrode and a second portion on an opposite side of the first portion from the first electrode;
a second SiC region of a second conductivity type in the SiC layer and surrounding the first portion of the first SiC region;
a third SiC region of the second conductivity type in the SiC layer and surrounding the second SiC region, the third SiC region having an impurity concentration of the second conductivity type lower than that of the second SiC region; and
a fourth SiC region in the SiC layer between the second SiC region and the third SiC region, the fourth SiC region having a crystal defect density higher than that of the second SiC region and that of the third Sic region.

14. The device according to claim 13, further comprising:
a second electrode on the second surface.

15. The device according to claim 13, wherein the first electrode is electrically coupled to the second SiC region.

16. The device according to claim 13, wherein the fourth Sic region contains argon (Ar).

17. A semiconductor device comprising:
a SiC layer that has a first surface and a second surface on an opposite side of the SiC layer from the first surface;
a first electrode in contact with the first surface;
a second electrode on the second surface;
a contact region of a second conductivity type in the SiC layer at the first surface and in contact with the first electrode;
a first SiC region of a first conductivity type in the SiC layer between the contact region and the second electrode;
a second SiC region of the second conductivity type in the SiC layer and surrounding the contact region;
a third SiC region of the second conductivity type in the SiC layer and surrounding the second SiC region, the third SiC region having an impurity concentration of the second conductivity type lower than that of the second SiC region; and
a fourth SiC region of the second conductivity type in the SiC layer between the second SiC region and the third SiC region, the fourth SiC region having an impurity concentration of the second conductivity type higher than that of the second SiC region.

18. The device according to claim 17, further comprising:
an anode region of the second conductivity type in the SiC layer between the contact region and the first SiC region; and
a cathode region of the first conductivity type in the SiC layer between the first SiC region and the second electrode.

19. The device according to claim 18, wherein the first electrode is electrically coupled to the second SiC region.

20. The device according to claim 18, wherein a depth from the first surface of the fourth SiC region is smaller than a depth from the first surface of the second SiC region and the third SiC region.

* * * * *